US010068959B2

(12) United States Patent
Kuriyagawa et al.

(10) Patent No.: US 10,068,959 B2
(45) Date of Patent: Sep. 4, 2018

(54) MANUFACTURING METHOD OF DISPLAY DEVICE AND DISPLAY DEVICE

(71) Applicant: Japan Display Inc., Tokyo (JP)

(72) Inventors: Takeshi Kuriyagawa, Tokyo (JP); Kazufumi Watabe, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/279,540

(22) Filed: Sep. 29, 2016

(65) Prior Publication Data
US 2017/0243933 A1 Aug. 24, 2017

(30) Foreign Application Priority Data

Feb. 24, 2016 (JP) .................................. 2016-032861

(51) Int. Cl.
 H01L 27/32 (2006.01)
 H01L 27/12 (2006.01)
 G02F 1/1362 (2006.01)
 G02F 1/1345 (2006.01)

(52) U.S. Cl.
 CPC ........ H01L 27/3276 (2013.01); H01L 27/124 (2013.01); H01L 27/1259 (2013.01); H01L 27/3248 (2013.01); H01L 27/3258 (2013.01); G02F 1/1362 (2013.01); G02F 1/13458 (2013.01); H01L 2227/323 (2013.01)

(58) Field of Classification Search
 CPC .......................... H01L 27/3276; G02F 1/13458
 See application file for complete search history.

(56) References Cited

U.S. PATENT DOCUMENTS

| 2005/0206828 A1* | 9/2005 | Lee ...................... H01L 27/3276 349/149 |
| 2011/0198572 A1* | 8/2011 | Park .................... H01L 27/3258 257/40 |
| 2014/0117334 A1 | 5/2014 | Nakamura et al. |
| 2015/0048330 A1* | 2/2015 | Kang .................. H01L 51/5209 257/40 |
| 2015/0060786 A1* | 3/2015 | Kwak ................. H01L 51/5253 257/40 |

FOREIGN PATENT DOCUMENTS

JP 2015-069857 A 4/2015

* cited by examiner

Primary Examiner — Moazzam Hossain
Assistant Examiner — Farun Lu
(74) Attorney, Agent, or Firm — Typha IP LLC

(57) ABSTRACT

A manufacturing method of a display device including a pixel region including a plurality of pixels each including a light emitting element and a terminal region provided outside the pixel region and including connection terminals; the method comprising: forming a recessed portion in a part of a top surface of each of the connection terminals; forming a first inorganic insulating layer, an organic insulating layer, and a second inorganic insulating layer sequentially in the pixel region and continuously in the terminal region; and etching the first inorganic insulating layer and the second inorganic insulating layer in an area where the first inorganic insulating layer and the second inorganic insulating layer are stacked directly, the area being on the top surface except the recessed portion.

12 Claims, 12 Drawing Sheets

MANUFACTURING METHOD OF DISPLAY DEVICE AND DISPLAY DEVICE

CROSS REFERENCE TO RELATED APPLICATIONS

This application is based upon and claims the benefit of priority from the prior Japanese Patent Application No. 2016-32861, filed on Feb. 24, 2016, the entire contents of which are incorporated herein by reference.

FIELD

The present invention relates to a manufacturing method of a display device and to a display device.

BACKGROUND

Japanese Laid-Open Patent Publication No. 2015-69857 discloses a display device including pixels each including a light emitting element formed of an organic electroluminescence (hereinafter, referred to as "organic EL") material. In this display device, a protective layer covering an organic EL layer is used as a sealing film. The protective layer includes a plurality of insulating layers (three layers of inorganic insulating layer/organic insulating layer/inorganic insulating layer) provided in a stacked manner.

Among the plurality of insulating layers, which are provided on a top surface of the organic EL layer, the inorganic layers are formed by sputtering and the organic layer is formed by application. Therefore, the plurality of insulating layers are provided in a pixel region (display region) and also extend to a terminal region (non-display region) of the display device. For this reason, on the region of each of connection terminals in the terminal region, the insulating layers need to be in a removable state and the connection terminals need to be in a conductive state.

The insulating layers may be removed from the terminal region by dry etching or wet etching. However, in order to remove the insulating layers including the inorganic insulating layer/organic insulating layer/inorganic insulating layer provided in a stacked manner, etching conditions suitable to the respective insulating layers need to be set. This involves problems that, for example, the manufacturing process is complicated, the margin is reduced, the tact time is increased, and in some cases, a plurality of processing chambers may be needed.

SUMMARY

According to an embodiment of the present invention, there is provided a manufacturing method of a display device including a pixel region including a plurality of pixels each including a light emitting element and a terminal region provided outside the pixel region and including connection terminals; the method comprising: forming a recessed portion in a part of a top surface of each of the connection terminals; forming a first inorganic insulating layer, an organic insulating layer, and a second inorganic insulating layer sequentially in the pixel region and continuously in the terminal region; and etching the first inorganic insulating layer and the second inorganic insulating layer in an area where the first inorganic insulating layer and the second inorganic insulating layer are stacked directly, the area being on the top surface except the recessed portion.

According to an embodiment of the present invention, there is provided a display device, comprising: a substrate; a pixel region including a plurality of pixels each including a light emitting element; a terminal region provided outside the pixel region, the terminal region including connection terminals; and a plurality of insulating layers provided from the pixel region to the terminal region continuously; wherein: the connection terminals each include a recessed portion in a part of a top surface thereof, the recessed portion having a dent recessed toward the substrate; in the pixel region, the plurality of insulating layers include a first inorganic insulating layer, an organic insulating layer provided on the first inorganic insulating layer, and a second inorganic insulating layer provided on the organic insulating layer; the top surface is exposed by the plurality of insulating layers; and the first inorganic insulating layer and the second inorganic insulating layer are provided in the dent of the recessed portion.

DESCRIPTION OF EMBODIMENTS

Figure 1:
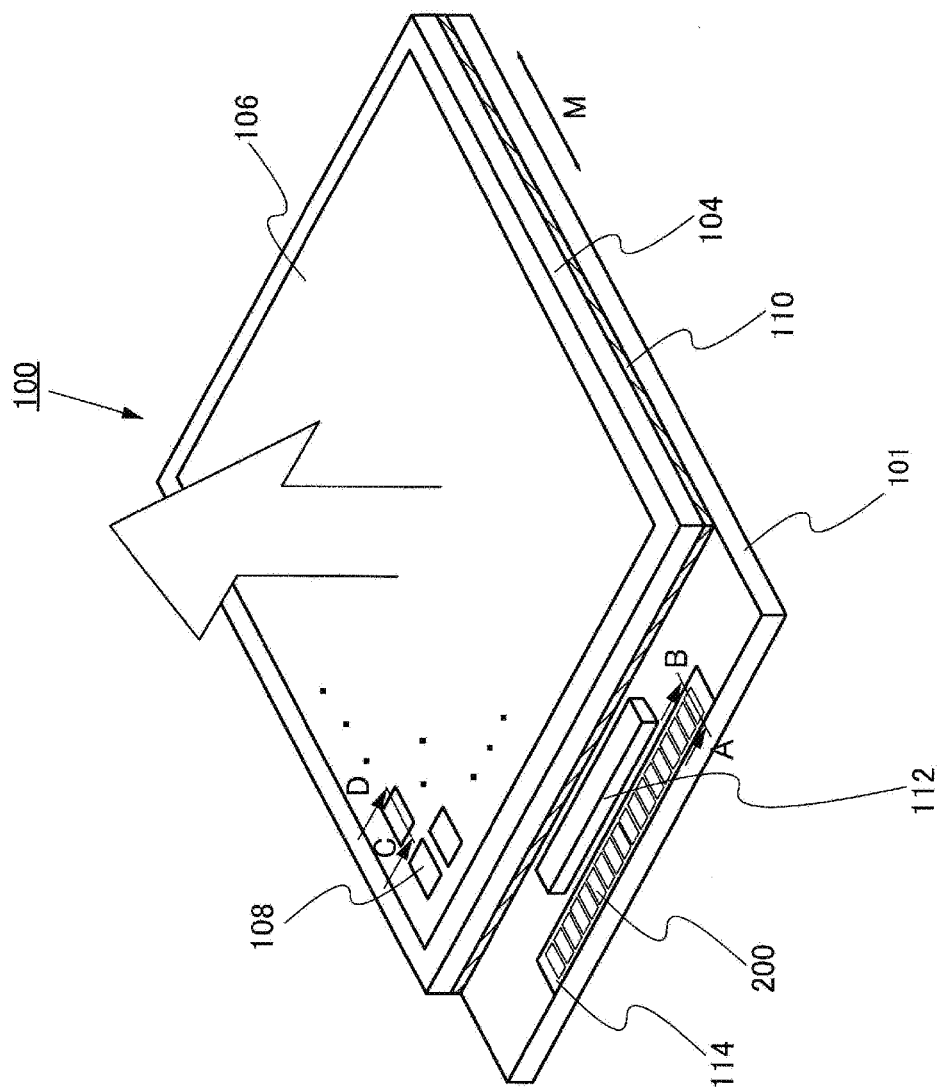
FIG. 1 is a perspective view showing a structure of a display device to which a manufacturing method in an embodiment according to the present invention is applicable.

Hereinafter, embodiments of the present invention will be described with reference to the drawings and the like. The present invention may be carried out in many different embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way.

In the specification and the drawings, components that are substantially the same as those shown in a previous drawing(s) bear the identical reference signs thereto, and detailed descriptions thereof may be omitted. The following embodiments have an object of simplifying the step of exposing a conductive surface in a region for each of connection terminals of the display device.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

Embodiment 1

FIG. 1 is a perspective view showing a structure of a display device 100 in embodiment 1. The display device 100 includes a first substrate 101 (may be simply referred to as a "substrate") and a display region 106 provided thereon. The display region 106 includes an array of a plurality of pixels 108, each of which includes a light emitting element. The light emitting element includes a layer containing a light emitting material (light emitting layer), which is provided between a pair of electrodes. Herein, the light emitting element is, for example, an organic EL element including a layer containing an organic electroluminescence material as the light emitting material. A second substrate 104 acting as a sealing member is provided on a top surface of the pixel region 106.

The second substrate 104 is secured to the first substrate 101 by a sealing member 110 enclosing the pixel region 106. The display region 106 formed on the first substrate 101 is sealed by the second substrate 104 acting as a sealing member and the sealing member 110 so as not to be exposed to the air. Such a sealing structure suppresses light emitting elements provided in the pixels 108 from being deteriorated. The light emitting elements are also sealed by a protecting layer including insulating layers described below (see FIG. 4).

The first substrate 101 has a terminal region 114 provided thereon along an end thereof. The terminal region 114 is located outside the second substrate 104. The terminal region 114 includes a plurality of connection terminals 200, which are provided outside the pixel region 106 and are each connectable with a wiring board such as a flexible printed circuit board (hereinafter, also referred to as the "FPC 80" (see FIG. 10)) or the like.

The connection terminals 200 are each connectable with the wiring board, which connects a device that outputs a video signal, a power supply or the like with a display panel. A contact of the connection terminal 200 with the wiring board is exposed outside. The first substrate 101 has a driver IC 112 provided thereon, which outputs a video signal input from the terminal region 114 to the pixel region 106.

Figure 2:
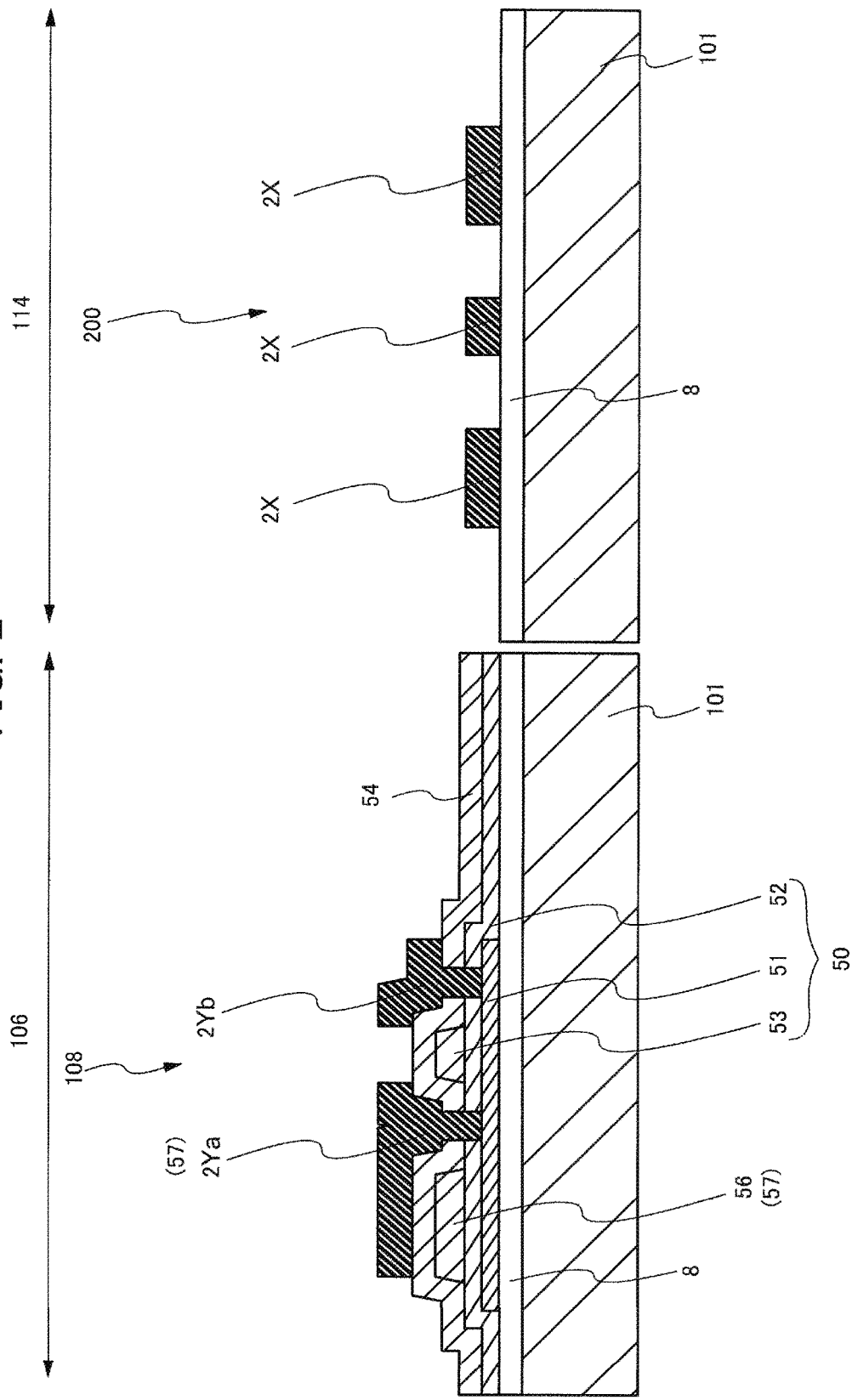
FIG. 2 is a cross-sectional view showing a state where on a first substrate, a pixel is partially formed in a pixel region and a connection terminal is partially formed in a terminal region.

Hereinafter, a manufacturing method of the display device 100 in an embodiment according to the present invention will be described. FIG. 2 shows a state where on the first substrate 101, a part of the pixel 108 is formed in the pixel region 106, and the connection terminal 200 is partially formed in the terminal region 114. The terminal region 114 of FIG. 2 is equivalent to the cross section along the A-B line of FIG. 1 (this also applies to FIG. 3 through FIG. 5). The pixel region 106 of FIG. 2 is equivalent to the cross section along the C-D line of FIG. 1 (this also applies to FIG. 3 through FIG. 5).

Figure 3:
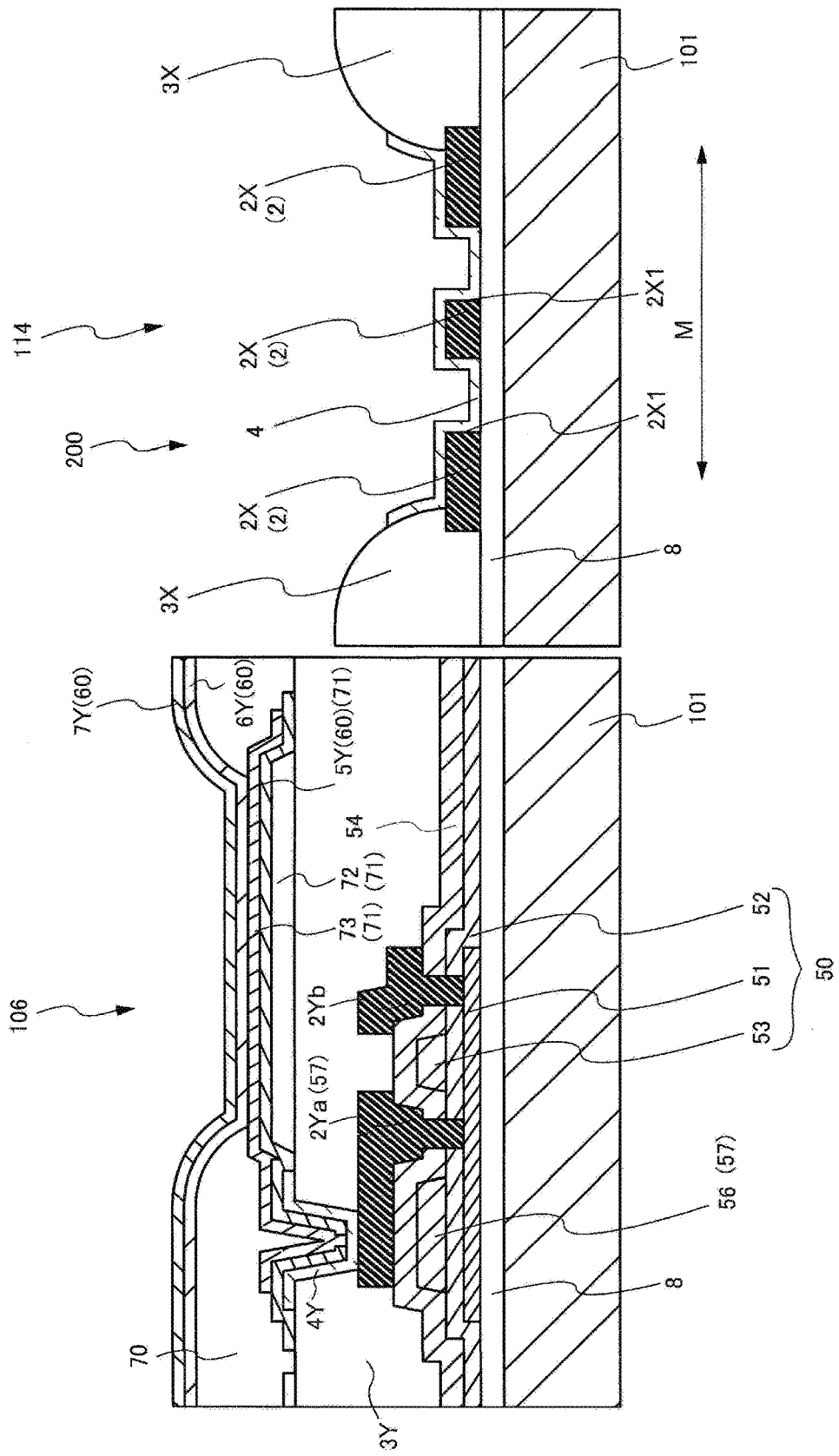
FIG. 3 is a cross-sectional view showing a state where a light emitting element, a third conductive layer and a second conductive layer are formed.

The pixel 108 is formed to include a transistor 50 and a light emitting element 60 (see FIG. 3). The transistor 50 includes a semiconductor layer 51, a gate insulating layer 52 and a gate electrode 53, which are formed on an underlying insulating layer 8.

In source/drain regions of the transistor 50, source/drain electrodes 2Ya and 2Yb are formed while having a first interlayer insulating layer 54 held therebetween. A second interlayer insulating layer 3Y is formed to embed the source/drain electrodes 2Ya and 2Yb.

The source/drain electrode 2Ya connected with the transistor 50 and a first capacitance electrode 56 formed on the gate insulating layer 52 form a first capacitance element 57. The first interlayer insulating layer 54 provided between the first capacitance electrode 56 and the source/drain electrode 2Ya also acts as a dielectric layer of the first capacitance element 57.

FIG. 3 is a cross-sectional view showing a state where the light emitting element 60, a third conductive layer 4Y and a second conductive layer 4 are formed. The light emitting element 60 includes a stack of a pixel electrode 5Y, an organic insulating layer 6Y and a counter electrode 7Y. The pixel electrode 5Y is enclosed by a bank layer 70.

The second interlayer insulating layer 3Y is formed between the pixel electrode 5Y and the source/drain electrodes 2Ya and 2Yb. The second interlayer insulating layer 3Y is formed of an organic insulating material. Since the second interlayer insulating layer 3Y is formed of an organic insulating material, a surface on which the light emitting element 60 is to be formed is flattened. The organic insulating material is, for example, a material containing an acrylic resin or the like.

In the example shown in FIG. 3, a second capacitance element 71 is provided so as to overlap the light emitting element 60. The second capacitance element 71 includes a second capacitance electrode 72, a third insulating layer 73 and the pixel electrode 5Y.

The light emitting element 60 and the transistor 50 are connected with each other via a contact hole formed in the second interlayer insulating layer 3Y. In the example shown in FIG. 3, the third conductive layer 4Y is provided between the pixel electrode 5Y and the source/drain electrode 2Ya. The third conductive layer 4Y is formed of, for example, a conductive metal oxide such as ITO or the like.

A first conductive layer 2X is formed of aluminum or an aluminum alloy having a low resistivity. A conductive metal oxide layer harder than aluminum is provided on a surface of the first conductive layer 2X to protect the first conductive layer 2X. Hereinafter, the connection terminal 200 will be specifically described.

The connection terminal 200 is provided on the first substrate 101 (substrate material). The first substrate 101 is formed of a resin or glass. On the first substrate 101, the underlying insulating layer 8 is formed. The underlying insulating layer 8 is formed of, for example, silicon oxide, silicon nitride or the like.

On the underlying insulating layer 8, the first conductive layer 2X is formed. The first conductive layer 2X is formed of, for example, an aluminum-containing compound (aluminum-based material) or the like.

In the terminal region 114, the connection terminal 200 includes the first conductive layer 2X and the second conductive layer 4 described below. The surface of the first conductive layer 2X (a part of a top surface of the connection terminal 200) has recessed portions 2X1 (recessed area). The recessed portions 2X1 each include a dent that is recessed toward the first substrate 101. The recessed portions 2X1 may be openings running throughout the first conductive layer 2X or may be formed as a result of a part of the first conductive layers 2X being thinned. In the latter case, the recessed portions 2X1 each have a bottom surface. It may be expressed that in a region for the connection terminal 200, the first conductive layer 2X is partially removed (the connection terminal 200 is partially removed) to form the recessed portions 2X1.

The second conductive layer 4 is provided on the first conductive layer 2X and in the recessed portions 2X1. After the first conductive layer 2X is formed but before the second conductive layer 4 is formed, a flattening film 3X is formed on two ends, in a width direction M, of the first conductive layer 2X. More specifically, the flattening film 3X is formed on the two ends, in the width direction M, of the first conductive layer 2X in the region for the connection terminal 200.

The second conductive layer 4 is formed on each part of the flattening film 3X on the side closer to the center in the width direction M, on the surface of the first conductive layer 2X, in the recessed portions 2X1, and on a surface of the underlying insulating layer 8 acting as the bottom surface of the recessed portions 2X1. The second conductive layer 4 is formed of a conductive metal oxide such as, for example, indium tin oxide (ITO) or the like.

The first conductive layer 2X, for example, forms the same layer with the source/drain electrodes 2Ya and 2Yb in the pixel 108 (see FIG. 1). Alternatively, the first conductive layer 2X may form the same layer with the gate electrode 53. In either case, the first conductive layer 2X is once embedded by the second interlayer insulating layer 3Y and the flattening film 3X, which are formed on the entirety over the first substrate 101.

However, after the second interlayer insulating layer 3Y is formed, a contact hole needs to be formed in the second interlayer insulating layer 3Y in order to connect the pixel electrode 5Y of the light emitting element 60 and the transistor 50 with each other. The step of forming the contact hole is the step of removing a part of the second interlayer insulating layer 3Y.

In the same step as the removal of the part of the second interlayer insulating layer 3Y in the pixel region 106, the flattening film 3Y is removed in the terminal region 114 so as to expose the surface of the first conductive layer 2X.

In this case, the flattening film 3X in the terminal region 114 may be entirely removed. Alternatively, as shown in FIG. 3, the flattening film 3X may be partially removed and thus partially left so as to enclose the first conductive layer 2X. In the case where the flattening film 3X is left so as to enclose the first conductive layer 2X, the coverage of steps of the second conductive layer 4 is improved. This will be described more specifically. The top surface and side surfaces of the first conductive layer 2X are covered with the second conductive layer 4. However, the second conductive layer 4 does not sufficiently cover the stepped portions (side surfaces) of the first conductive layer 2X. The flattening film 3X left so as to enclose the conductive layer 2X alleviates this inconvenience. The second interlayer insulating layer 3Y and the flattening film 3X may be formed of a photosensitive resin.

Figure 4:
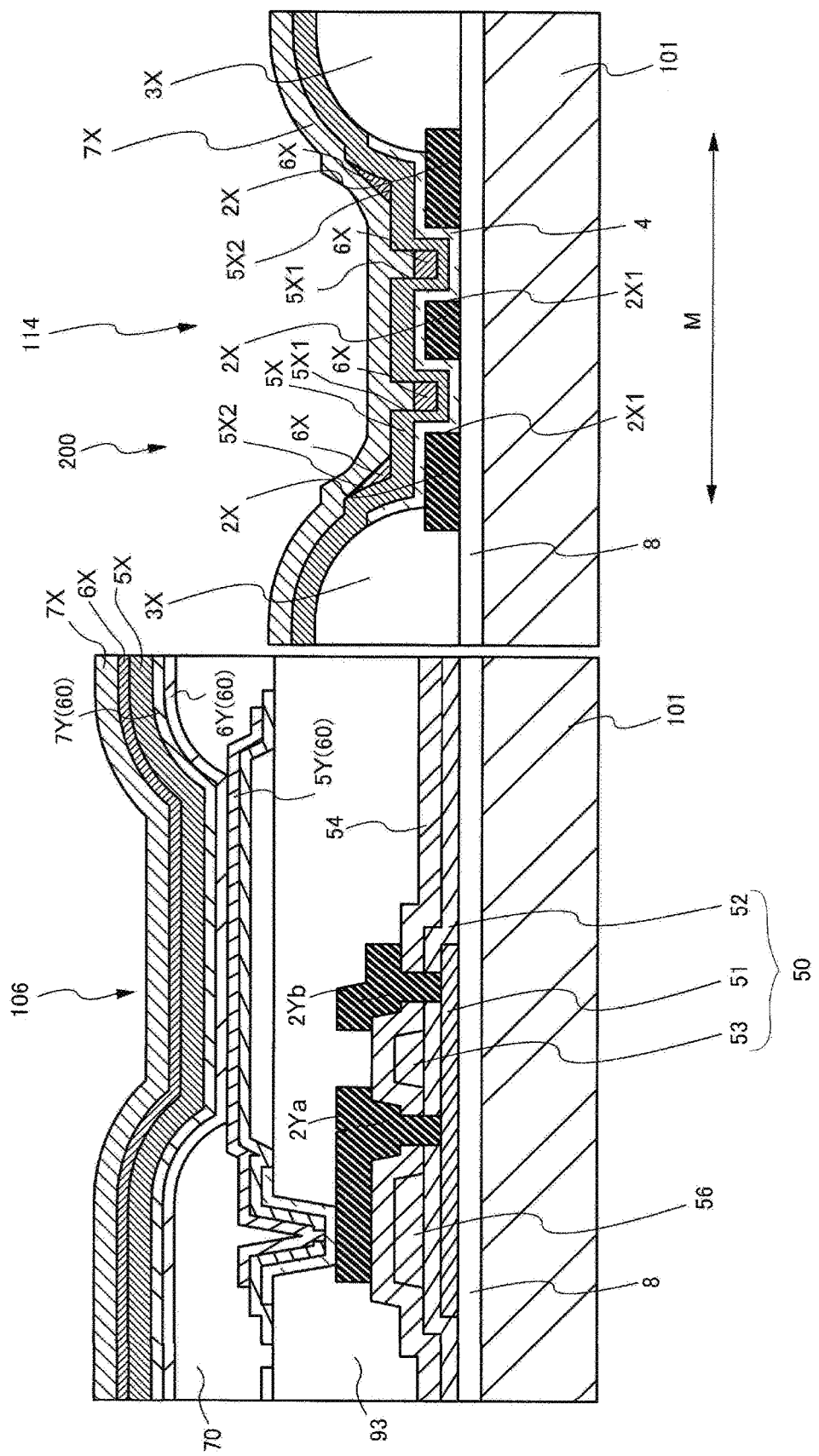
FIG. 4 is a cross-sectional view showing a state where a pixel electrode, an organic insulating layer and a counter electrode are formed in the pixel region, and a protective layer including a stack of a first inorganic insulating layer, an organic insulating layer and a second inorganic insulating layer is formed on the connection terminal.

FIG. 4 shows a state where the pixel electrode 5Y, the organic insulating layer 6Y and the counter electrode 7Y are formed in the pixel region 106, and then a protective layer including a stack of a first inorganic insulating layer 5X, an organic insulating layer 6X and a second inorganic insulating layer 7X is formed in the pixel region 106 and the terminal region 114. Among the layers of the protective layer, the inorganic insulating layers 5X and 7X are formed by sputtering, and the organic insulating layer 6X is formed by application. Therefore, the protective layer is formed on substantially the entirety over the first substrate 101. As a result, in the terminal region 114, the organic insulating layer 6X is concentrated in the recessed portions 2X1. In the pixel region 106, the protective layer including the stack of the first inorganic insulating layer 5X, the organic insulating layer 6X and the second inorganic insulating layer 7X is located on the counter electrode 7Y, and protects and seals the light emitting element 60. Specifically, the protective layer is formed as follows.

As shown in FIG. 4, the first inorganic insulating layer 5X is formed in the pixel region 106 and continuously in the terminal region 114. Specifically in the terminal region 114, the first inorganic insulating layer 5X is formed on a stack of the first conductive layer 2X and the second conductive layer 4 and on the flattening film 3X. A surface of the first inorganic insulating layer 5X is recessed to form recessed portions 5X1 and stepped portions 5X2.

Then, in the pixel region 106 and continuously in the terminal region 114, the organic insulating layer 6X is formed. Specifically in the terminal region 114, the organic insulating layer 6X is formed on the first inorganic insulating layer 5X. The organic insulating layer 6X is formed by applying and baking a flowable resin composition.

By contrast, the resin composition applied to the region for the connection terminal 200 flows toward the recessed portions 2X1 of the first conductive layer 2X but does not stay around the recessed portions 2X1. Therefore, in the terminal region 114, the organic insulating layer 6X is formed based on the shape of the recessed portions 2X1. Namely, the resin composition is concentrated in the recessed portions 5X1 and the stepped portions 5X2 of the first inorganic insulating layer 5X. The organic insulating layer 6X is formed of an insulating resin material such as an acrylic resin, polyimide or the like.

In the terminal region 114, the second inorganic insulating layer 7X is formed on the first inorganic insulating layer 5X having the organic insulating layer 6X formed therein. In this manner, the plurality of insulating layers, specifically, the first inorganic insulating layer 5X, the organic insulating layer 6X and the second inorganic insulating layer 7X, are formed.

In the region for the connection terminal 200, the first inorganic insulating layer 5X and the second inorganic insulating layer 7X are adjacent to each other in a stacked state in an up-down direction in an area except for the recessed portions 2X1 in the width direction M. In this example, the first inorganic insulating layer 5X and the second inorganic insulating layer 7X are formed of the same material as each other. Therefore, the first inorganic insulating layer 5X and the second inorganic insulating layer 7X are etched in the same step. In this case, as compared with the case where the first inorganic insulating layer 5X, the organic insulating layer 6X and the second inorganic insulating layer 7X provided in a stacked manner are etched, the number of etching steps is decreased (from three steps to one step).

In the case where the first inorganic insulating layer 5X and the second inorganic insulating layer 7X are formed of different materials from each other, the second inorganic insulating layer 7X is etched and then the first inorganic insulating layer 5X is etched. Even in this case, as compared with the case where the first inorganic insulating layer 5X, the organic insulating layer 6X and the second inorganic insulating layer 7X provided in a stacked manner are etched, the number of etching steps is decreased (from three steps to two steps).

Figure 5:
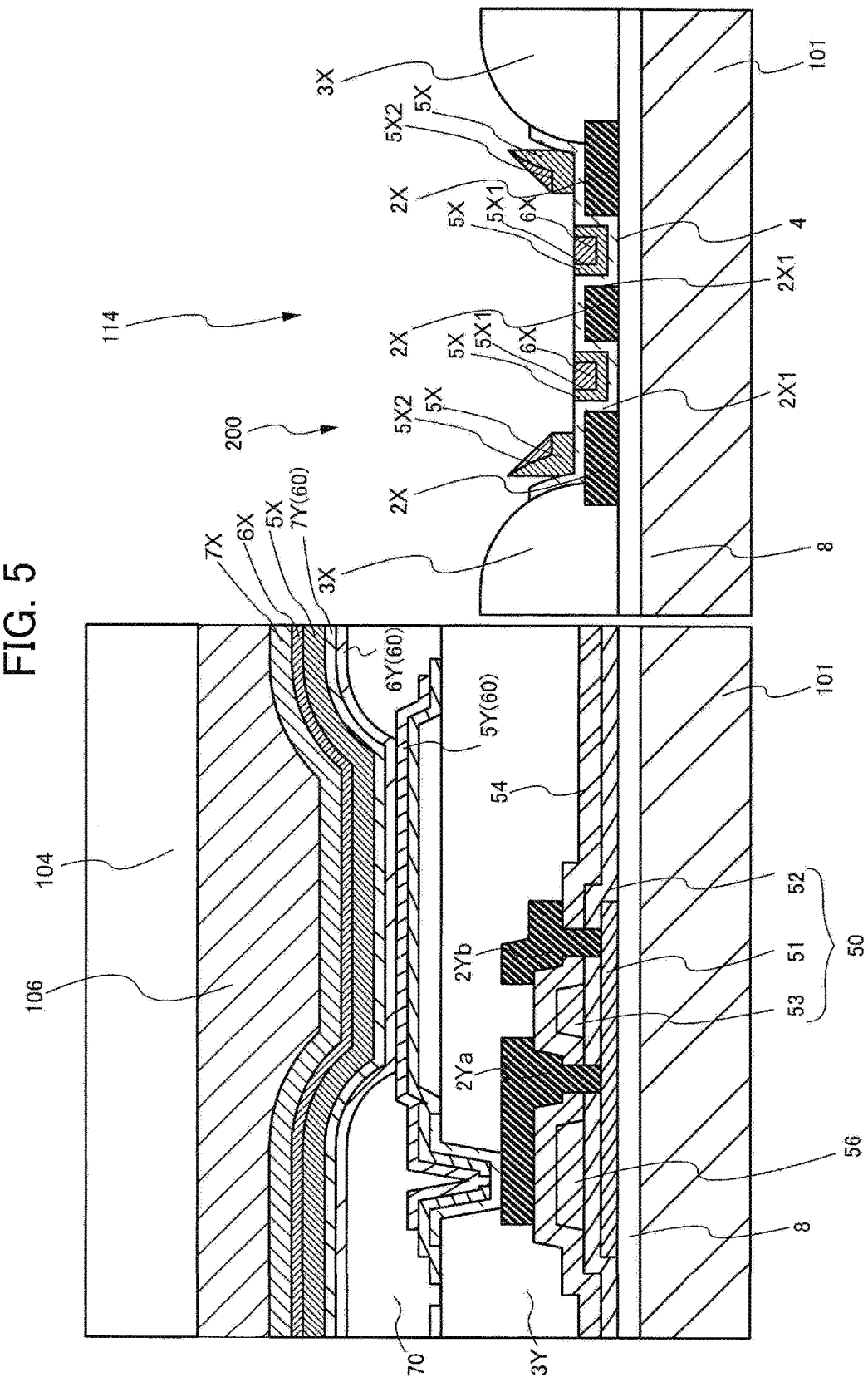
FIG. 5 is a cross-sectional view showing a state where a second substrate is formed in the pixel region.

FIG. 5 shows a state where the second substrate 104 shown in FIG. 1 is provided in the pixel region 106. In the terminal region 114, the first inorganic insulating layer 5X and the second inorganic insulating layer 7X are etched after the state of the terminal region 114 become as shown in FIG. 4.

In each of the recessed portions 2X1, the second conductive layer 4 and the first inorganic insulating layer 5X are formed along the shape of the recessed portion 2X1, and the organic insulating layer 6X (organic resin layer) is formed in the recessed portion 5X1 of the first inorganic insulating layer 5X. The organic insulating layer 6X is formed of, for example, an acrylic resin.

It is preferable that as seen from a direction perpendicular to the directions in which the first substrate 101 expands, the second conductive layer 4 has an area size that is 50% or more of the area size of the first conductive layer 2X.

In this manner, the plurality of insulating layers including the first inorganic insulating layer 5X, the organic insulating layer 6X and the second inorganic insulating layer 7X are formed in the pixel region 106. In the same step, in the region for the connection terminal 200, the second conductive layer 4 is exposed from the plurality of insulating layers, and the first inorganic insulating layer 5X and the organic insulating layer 6X are provided in the recessed portions 2X1. Therefore, the plurality of insulating layers are formed from the pixel region 106 to the terminal region 114.

Figure 6:
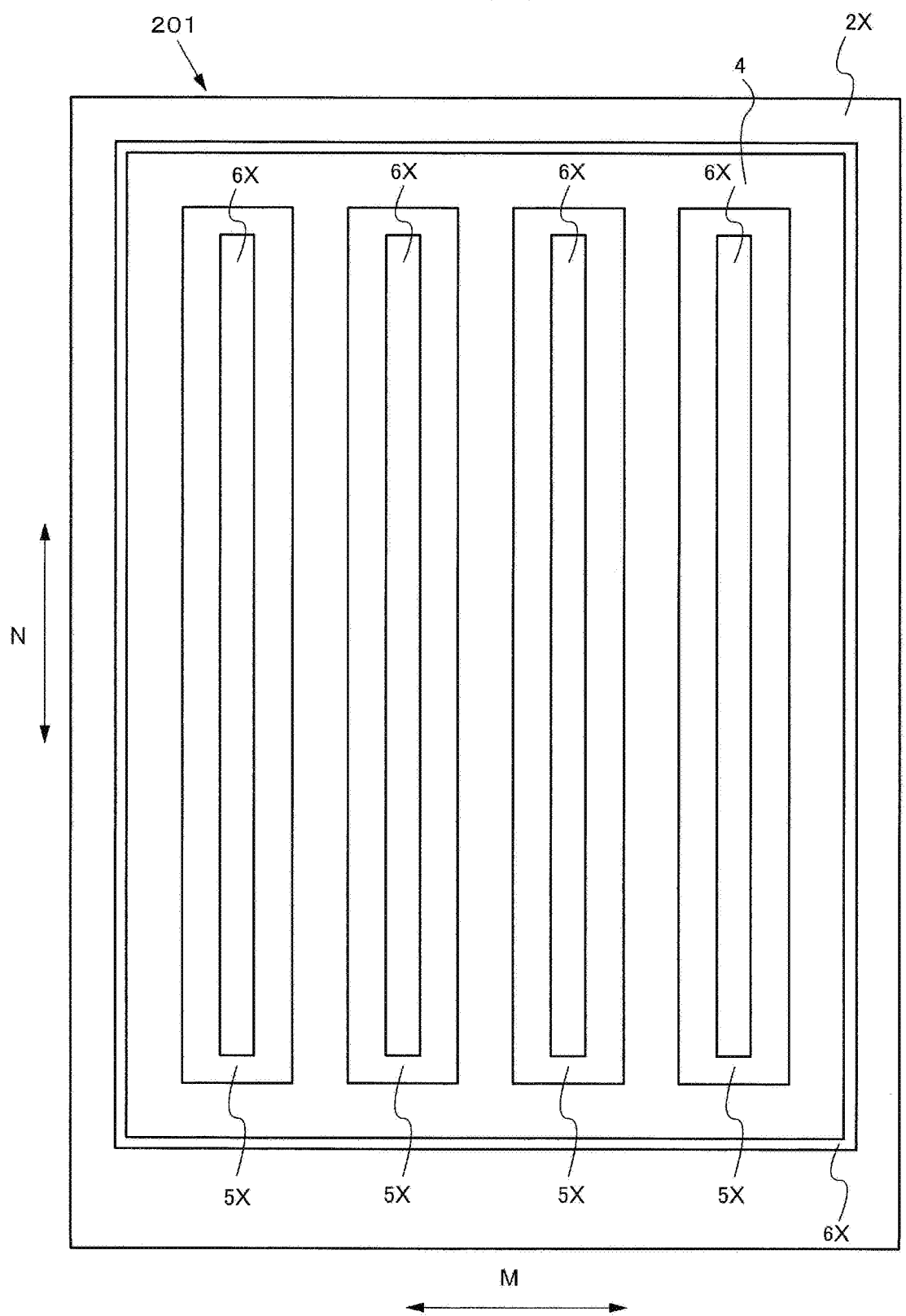
FIG. 6 is a plan view showing a structure of a connection terminal in modification 1 of embodiment 1.

FIG. 6 is a plan view of a connection terminal 201 in modification 1 of embodiment 1. The connection terminal 201 includes a plurality of unit areas each including the first inorganic insulating layer 5X and the organic insulating layer 6X both extending in a length direction N. The first inorganic insulating layer 5X and the organic insulating layer 6X are provided on the first conductive layer 2X. Such unit areas are provided in a matrix of 1 (length direction N)×4 (width direction M).

Figure 7:
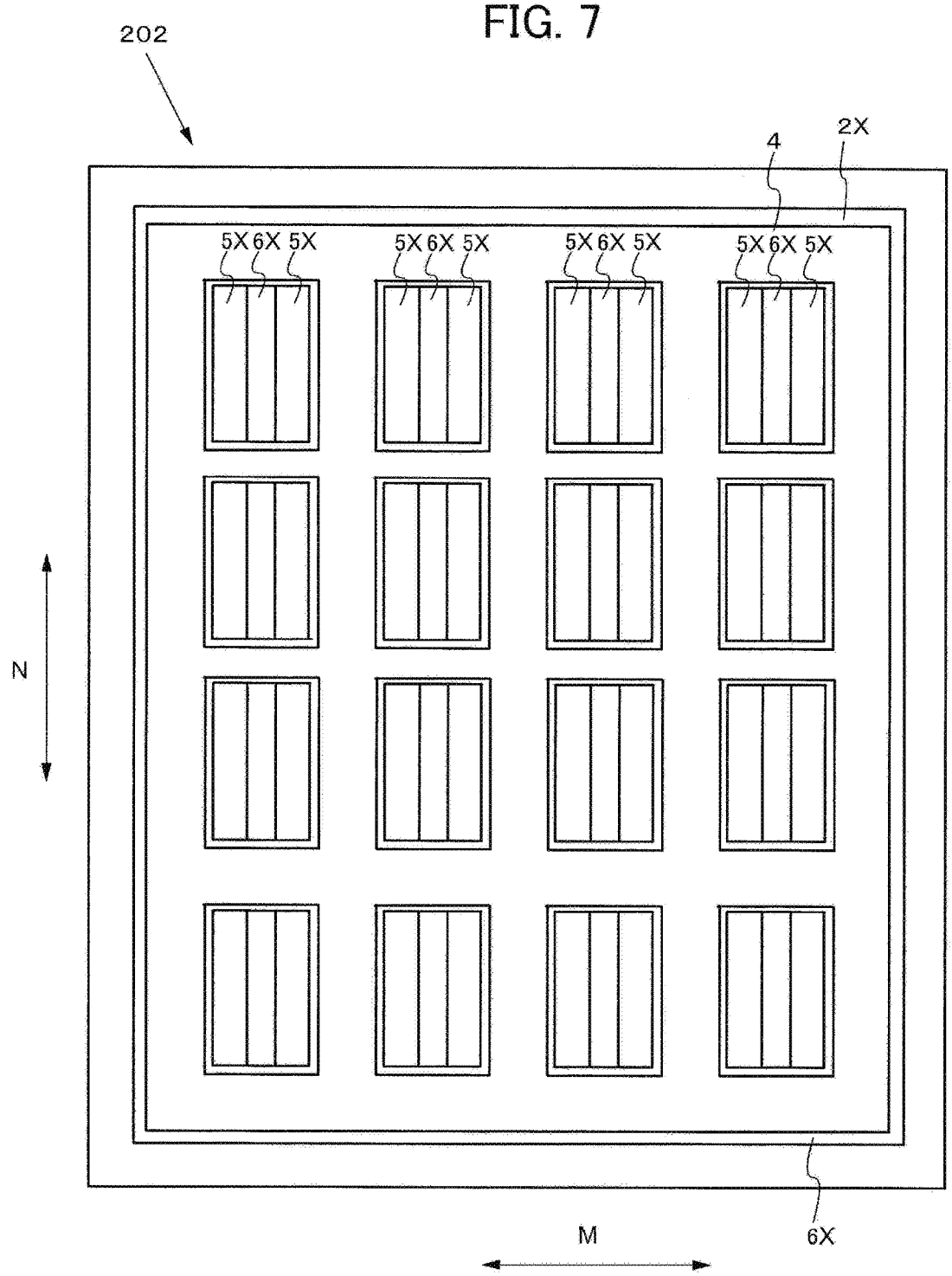
FIG. 7 is a plan view showing a structure of a connection terminal in modification 2 of embodiment 1.

FIG. 7 is a plan view of a connection terminal 202 in modification 2 of embodiment 1. The connection terminal 202 includes a plurality of unit areas each including the first inorganic insulating layer 5X and the organic insulating layer 6X both extending in the length direction N. The first inorganic insulating layer 5X and the organic insulating layer 6X are provided on the first conductive layer 2X. Such unit areas are provided in a matrix of 4 (length direction N)×4 (width direction M).

Figure 8:
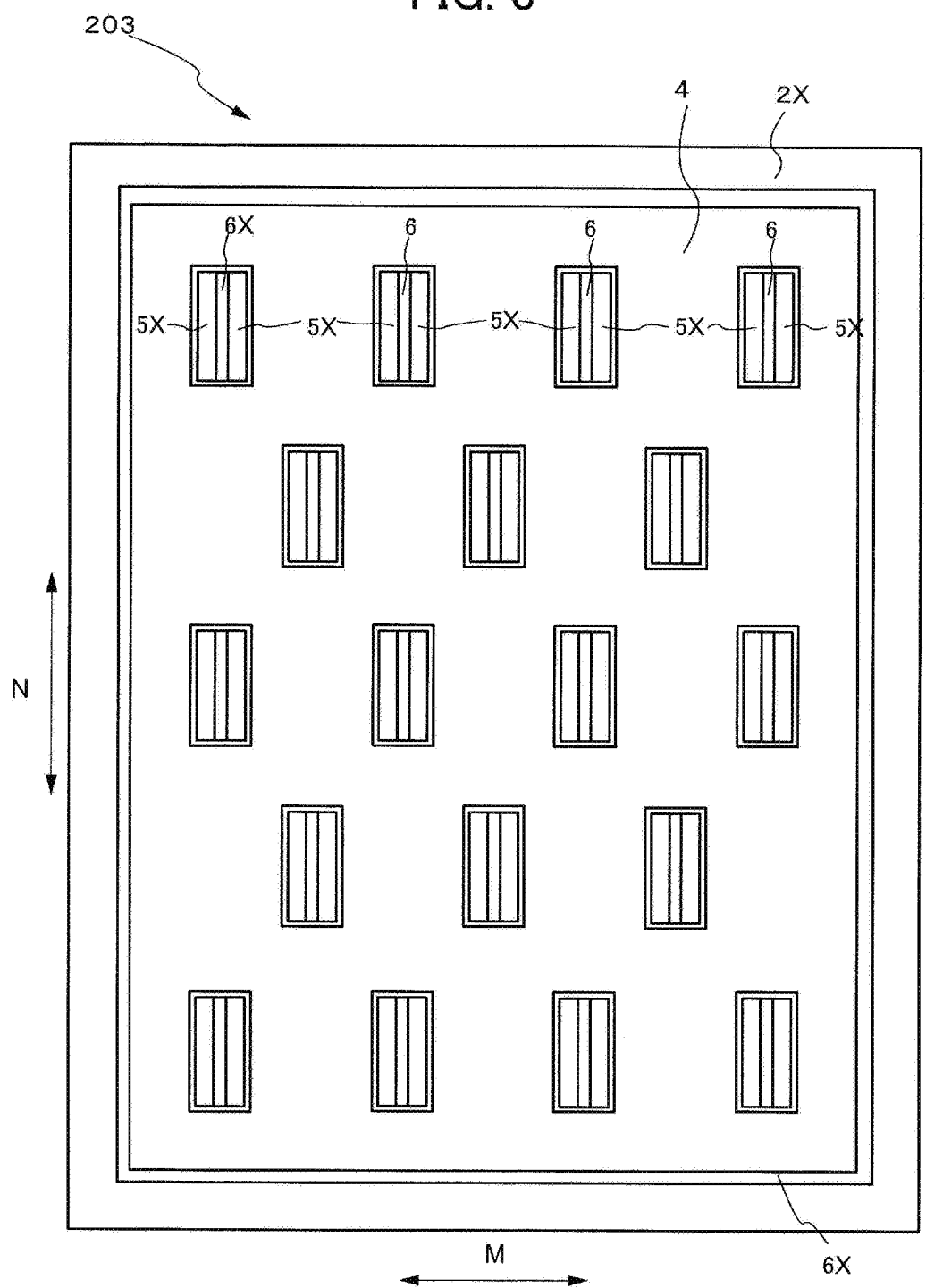
FIG. 8 is a plan view showing a structure of a connection terminal in modification 3 of embodiment 1.

FIG. 8 is a plan view of a connection terminal 203 in modification 3 of embodiment 1. The connection terminal 203 includes a plurality of unit areas each including the first inorganic insulating layer 5X and the organic insulating layer 6X both extending in the length direction N. The first inorganic insulating layer 5X and the organic insulating layer 6X are provided on the first conductive layer 2X. Such unit areas are arranged in five rows; namely, five such unit areas are provided in the length direction N. Regarding the width direction M, in first, third and fifth rows, four such unit area are provided, and in the second and fourth rows, three such unit areas are provided. The four unit areas and the three unit areas are provided alternately.

Figure 9:
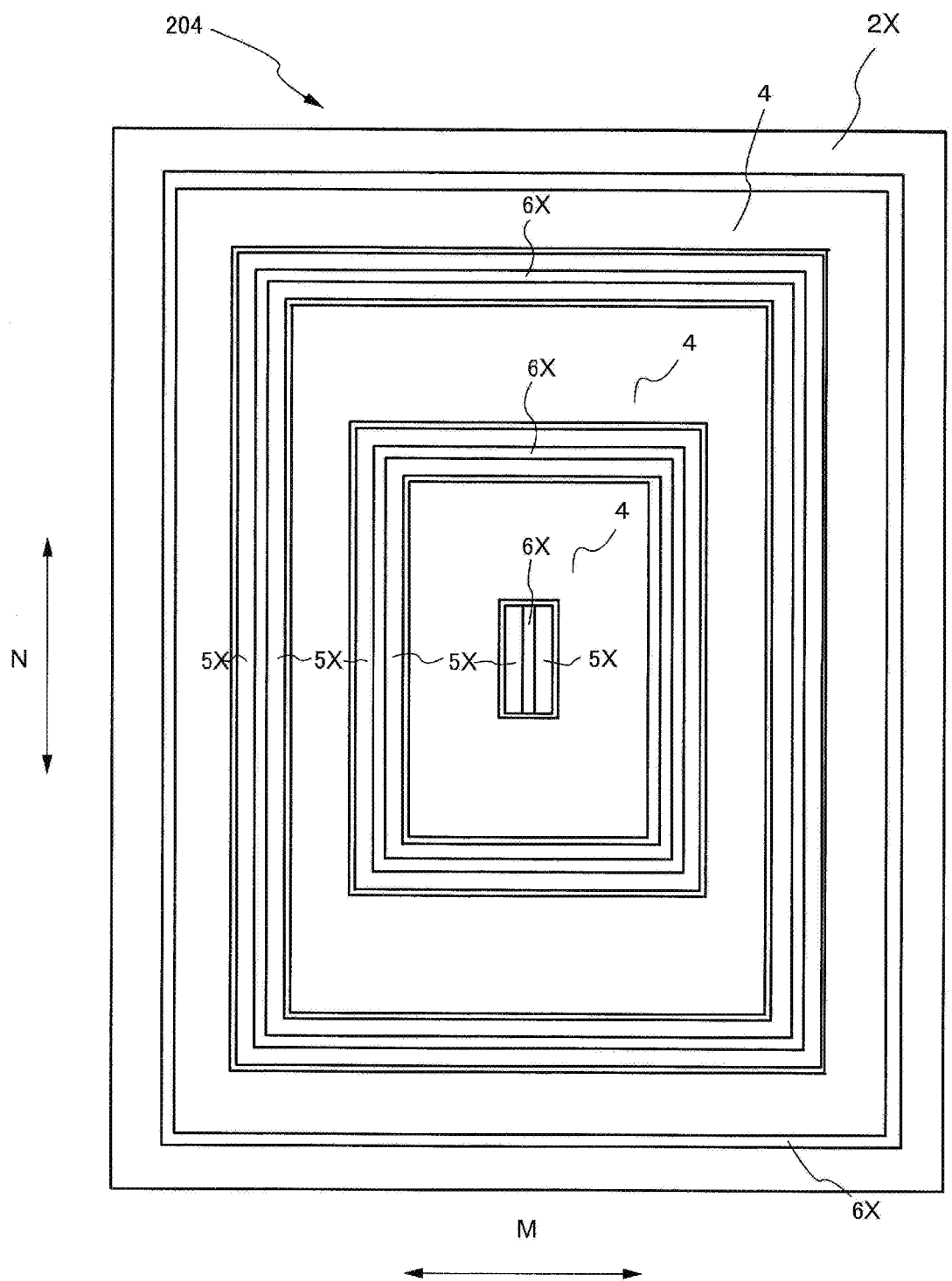
FIG. 9 is a plan view showing a structure of a connection terminal in modification 4 of embodiment 1.

FIG. 9 is a plan view of a connection terminal 204 in modification 4 of embodiment 1. The connection terminal 204 includes a plurality of unit areas each including the first inorganic insulating layer 5X and the organic insulating layer 6X. The first inorganic insulating layer 5X and the organic insulating layer 6X are provided on the first conductive layer 2X. In the central unit area in FIG. 9, the first inorganic insulating layer 5X and the organic insulating layer 6X extend in the length direction N. In the other unit areas, the first inorganic insulating layer 5X and the organic insulating layer 6X extend in both of the length direction N and the width direction M, namely, in a hole shape or a rectangular frame pattern.

Regarding FIG. 6 through FIG. 9, there is no specific limitation on the number of the recessed portions 2X1. In FIG. 6 through FIG. 9, it is preferable that the area size of the exposed part of the second conductive layer 4 is 50% or more of the area size of the first conductive layer 2X.

Figure 10:
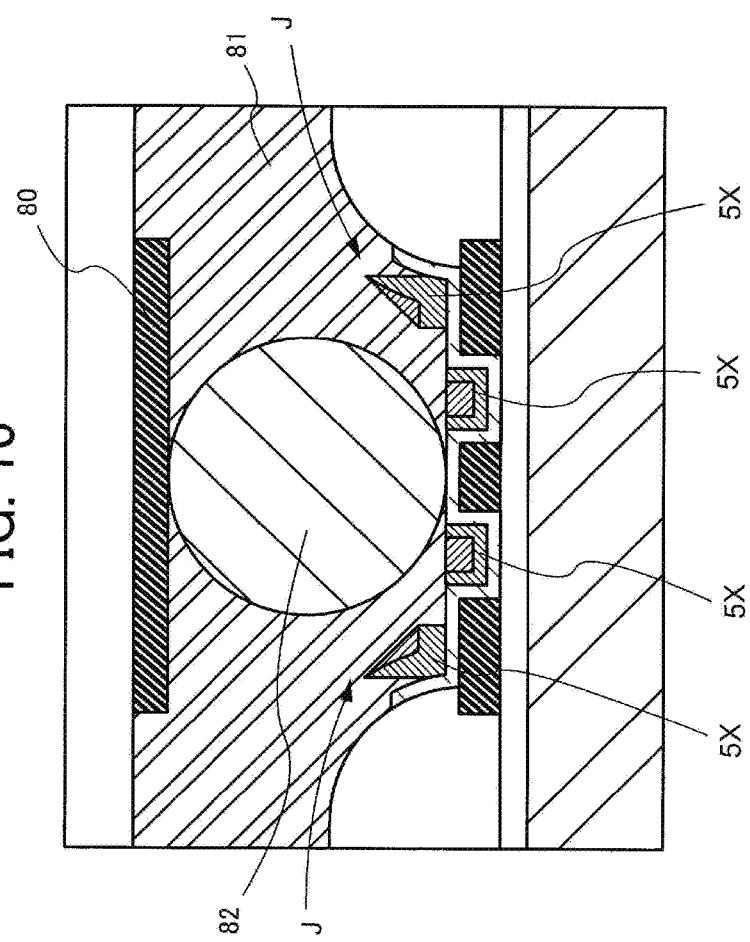
FIG. 10 is a cross-sectional view showing a state where an FPC is formed in the terminal region.

FIG. 10 shows a state where the FPC 80 is provided in the terminal region 114. The connection terminal 200 is connected with FPC 80 by, for example, an anisotropic conductive adhesive (ACF) 81. A conductive bead 82 is larger than the first inorganic insulating layer 5X left in areas represented by arrow J. Therefore, even in the case where the first inorganic insulating layer 5X is left in the areas represented by arrow J as shown in FIG. 10, the first inorganic insulating layer 5X does not have any influence, but may rather act as a stopper for the conductive bead 82.

Embodiment 2

Figure 11:
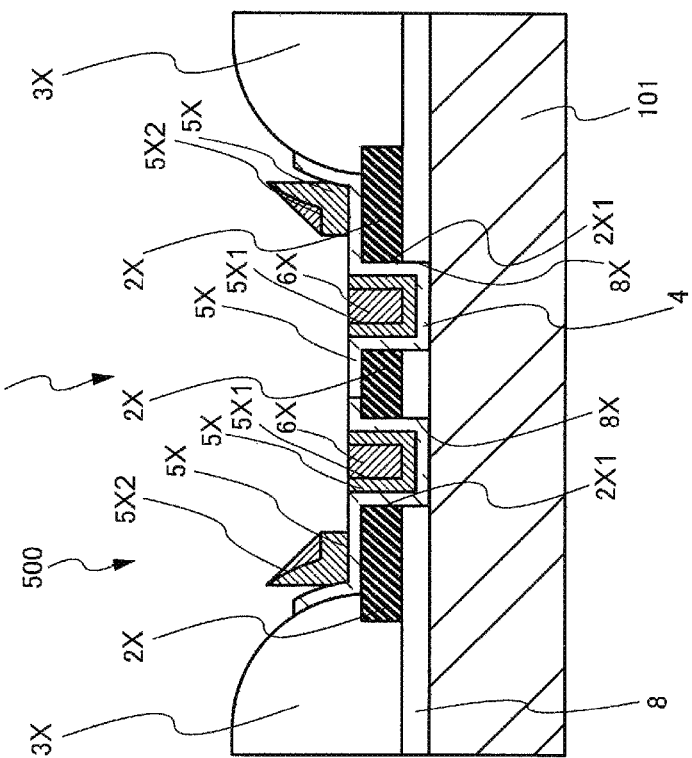
FIG. 11 is a cross-sectional view showing a step of forming layers of a connection terminal in embodiment 2 according to the present invention.

Now, with reference to FIG. 11, a structure of a connection terminal 500 in embodiment 2 will be described. FIG. 11 is a cross-sectional view showing a state where etching performed on the insulating layers in the connection terminal 500 is finished. Unlike in the connection terminal 200 in embodiment 1, in the connection terminal 500 in embodiment 2, the underlying insulating layer 8 is partially removed in a region for the connection terminal 500 to form recessed portions. More specifically, the underlying insulating layer 8 and the first conductive layer 2X are formed on the first substrate 101, and then, the recessed portions each including a recessed portion 8X and the recessed portion 2X1 communicated with each other are formed.

Alternatively, the recessed portions may be formed as follows. The recessed portions 8X are formed in the underlying insulating layer 8. Then, the first conductive layer 2X is formed thereon, and the first conductive layer 2X is partially removed to form the recessed portions 2X1.

Embodiment 3

Figure 12:
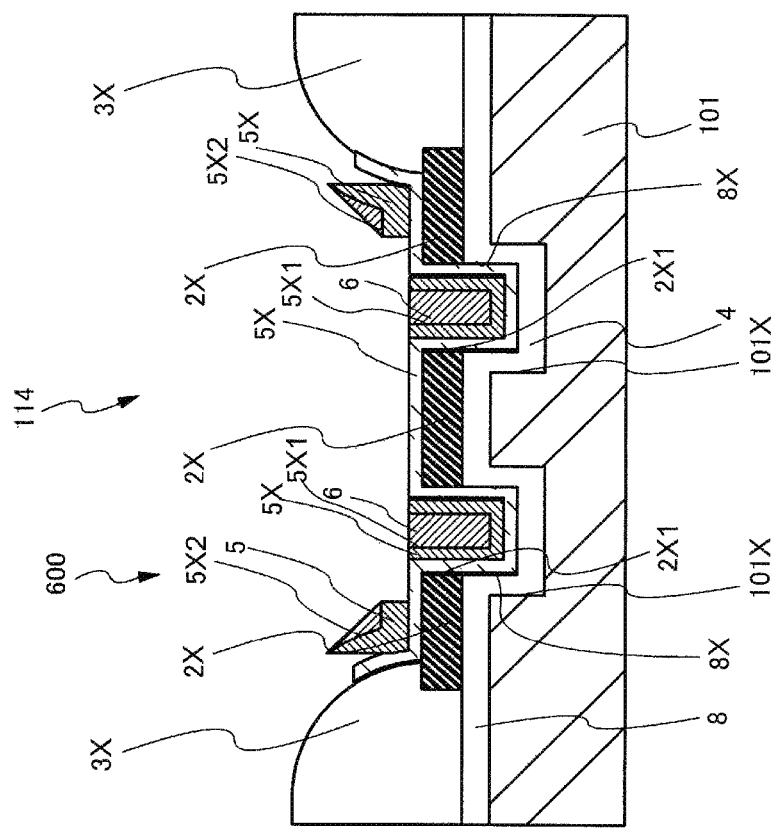
FIG. 12 is a cross-sectional view showing a step of forming layers of a connection terminal in embodiment 3 according to the present invention.

Now, with reference to FIG. 12, a structure of a connection terminal 600 in embodiment 3 will be described. FIG. 12 is a cross-sectional view showing a state where etching performed on the insulating layers in the connection terminal 600 is finished. Unlike in the connection terminal 200 in embodiment 1, in the connection terminal 600 in embodiment 3, the first substrate 101 is partially removed to form recessed portions. More specifically, the first substrate 101 is partially removed to form recessed portions 101X, then the underlying insulating layer 8 and the first conductive layer 2X are formed, and the recessed portions 8X and 2X1 are formed.

Alternatively, the recessed portions may be formed as follows. The underlying insulating layer 8 is formed on the first substrate 101, and then recessed portions each including the recessed portion 101X and the recessed portion 2X1 communicated with each other are formed. Then, the first conductive layer 2X is formed thereon, and the first conductive layer 2X is partially formed to form the recessed portions 2X1. Still alternatively, the recessed portions may be formed as follows. The underlying insulating layer 8 and the first conductive layer 2X are formed on the first substrate 101. Then, recessed portions each including the recessed portion 101X, the recessed portion 8X and the recessed portion 2X1 are formed.

With any of the methods in embodiments 1 through 3, the organic insulating layer 6X is concentrated in the first inorganic insulating layer 5X (more specifically, in the recessed portions 5X1) formed in the recessed portions 2X1. Therefore, after the step of forming the plurality of insulating layers (the first inorganic insulating layer 5X, the organic insulating layer 6X, and the second inorganic insulating layer 7X) in a stacked manner on the first conductive layer 2X, which is formed on the first substrate 101, the plurality of insulating layers on the first conductive layer 2X may be removed more easily than by a conventional method.

As a result, for example, in each of the embodiments, the manufacturing process of the connection terminals is simplified, the time for the manufacturing is shortened, and the stability is improved in the manufacturing. In addition, the first conductive layer 2X having the recessed portions 2X1 allows the IC or FPC 80 to be connected by an ACF with more certainty than a flat first conductive layer. Thus, the reliability of the product, for example, the display device 100, is improved.

What is claimed is:

1. A display device, comprising:
a substrate;
a pixel region including a plurality of pixels each including a light emitting element;
a terminal region provided outside the pixel region, the terminal region including connection terminals; and
a plurality of insulating layers provided from the pixel region to the terminal region continuously;
wherein:
the connection terminals each have a top surface and include at least a recessed portion, the recessed portion is recessed from the top surface toward the substrate;
in the pixel region, the plurality of insulating layers include a first inorganic insulating layer, an organic insulating layer provided on the first inorganic insulating layer, and a second inorganic insulating layer provided on the organic insulating layer;
the first inorganic insulating layer and the organic insulating layer are provided in the recessed portion;
the pixel region and the terminal region are provided on a stack of the substrate and an underlying insulating layer provided on the substrate; and
the recessed portion is a portion where a part of the stack of the substrate and the underlying insulating layer is removed in a region for each of the connection terminals.

2. The display device according to claim 1, wherein the recessed portion is a portion where a part of each of the connection terminals is removed.

3. The display device according to claim 1, wherein the recessed portion is a portion where a part of the substrate is removed in a region for each of the connection terminals.

4. The display device according to claim 2, wherein the recessed portion is a portion where a part of the substrate is removed in a region for each of the connection terminals.

5. The display device according to claim 1, wherein the plurality of insulating layers cover the light emitting element.

6. The display device according to claim 1, wherein the at least a recessed portion comprises a plurality of recessed portions.

7. The display device according to claim 6, wherein the plurality of recessed portions are arranged in a direction.

8. The display device according to claim 6, wherein the plurality of recessed portions are arranged in a matrix.

9. The display device according to claim 6, wherein the plurality of recessed portions are arranged in a staggered array.

10. The display device according to claim 6, wherein the plurality of recessed portions include a first recessed portion and a second recessed portion which surrounds the first recessed portion.

11. The display device according to claim 1, wherein a part of the organic insulating layer is located above the top surface, and
the part of the organic insulating layer separates from and surrounds the recessed portion.

12. The display device according to claim 11, wherein a part of the first inorganic insulating layer is located on the top surface and in contact with the part of the organic insulating layer.

* * * * *